United States Patent
Sugihara et al.

(10) Patent No.: US 11,129,316 B2
(45) Date of Patent: Sep. 21, 2021

(54) COMPONENT SUPPLY DEVICE

(71) Applicant: FUJI CORPORATION, Chiryu (JP)

(72) Inventors: Akio Sugihara, Chiryu (JP); Hiromi Suzuki, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 363 days.

(21) Appl. No.: 16/305,322

(22) PCT Filed: May 31, 2016

(86) PCT No.: PCT/JP2016/065969
§ 371 (c)(1),
(2) Date: Nov. 28, 2018

(87) PCT Pub. No.: WO2017/208324
PCT Pub. Date: Dec. 7, 2017

(65) Prior Publication Data
US 2020/0323111 A1    Oct. 8, 2020

(51) Int. Cl.
*H05K 13/04*    (2006.01)
*H05K 13/00*    (2006.01)

(52) U.S. Cl.
CPC ..... *H05K 13/0417* (2013.01); *H05K 13/0084* (2013.01); *H05K 13/0406* (2018.08); *H05K 13/0409* (2018.08)

(58) Field of Classification Search
CPC ........... H05K 13/0084; H05K 13/0406; H05K 13/0409; H05K 13/130417
See application file for complete search history.

(56) References Cited

U.S. PATENT DOCUMENTS 5,636,725 A * 6/1997 Saito .................... H05K 13/043
198/396
5,836,437 A * 11/1998 Saito .................... H05K 13/028
198/396

(Continued)

FOREIGN PATENT DOCUMENTS

| EP | 0 396 521 A2 | 11/1990 |
| EP | 2 835 214 A1 | 2/2015 |
| WO | WO 2015/097904 A1 | 7/2015 |

OTHER PUBLICATIONS

International Search Report dated Aug. 16, 2016 in PCT/JP2016/065969 filed May 31, 2016.

*Primary Examiner* — Carl J Arbes
(74) *Attorney, Agent, or Firm* — Oblon, McClelland, Maier & Neustadt, L.L.P.

(57) ABSTRACT

A loose component supply device including component support member 150 configured to support components in a scattered state; and component supply apparatus 88 configured to store components and discharge components towards the component support member from discharge opening 98, wherein, in the component supply apparatus, conveyor belt 112 is arranged between storage section 100 that stores components and a discharge opening so as to extend diagonally upwards from the storage section on the side on which the discharge section is provided. Components housed in the housing section are discharged from the discharge opening towards the component support member by being conveyed by the conveyor belt. The component supply apparatus is removably mounted on the mounting section. Thus, because components are not discharged from the discharge opening unless the conveyor is operated, components do not fall from the discharge opening when the component supply apparatus is mounted on or removed from the mounting section.

7 Claims, 14 Drawing Sheets

(56) References Cited

U.S. PATENT DOCUMENTS 5,988,353 A * 11/1999 Asai .................. H05K 13/0413
                     198/468.4
6,374,986 B1 * 4/2002 Oe ..................... H05K 13/0417
                     198/396

* cited by examiner

COMPONENT SUPPLY DEVICE

TECHNICAL FIELD

The present application relates to a component supply device configured to scatter components stored in a component housing apparatus onto a support surface of a component support section so as to supply the components in a scattered state.

BACKGROUND ART

Among component supply devices, there is a known device that scatters components stored in a component housing apparatus such as a hopper onto a component support section so as to supply the components in a scattered state. An example of such a component supply device is disclosed in the patent literature below, and with such a component supply device the component housing apparatus is removably mounted on a mounting section.
Patent literature 1: WO2015/097904

BRIEF SUMMARY

Technical Problem

According to a component supply device disclosed in the above patent literature, by removing the component housing apparatus from the mounting section, actions such as collection of components from the component housing apparatus and maintenance of the component housing apparatus can be performed outside the component supply device. However, with a component supply device disclosed in the above patent literature, because a discharge section of the component housing apparatus is open, components stored in the component housing apparatus may fall out from the opening when the component housing apparatus is mounted or removed. The present disclosure takes account of such circumstances and an object thereof is to provide a component supply device configured to prevent components falling from a discharge section.

Solution to Problem

To solve the above problems, a component supply device of the present disclosure includes: a component support section configured to support multiple components in a scattered state on a support surface of the component support section; a component housing apparatus configured to house the components and to discharge the components from a discharge section towards the support surface of the component support section; and a mounting section on which the component housing apparatus is removably mounted, wherein the component housing apparatus includes a housing section configured to house the components, and a conveyor belt configured to demarcate the housing section and the discharge section and arranged extending from the housing section diagonally upwards to a side on which the discharge section is provided, and the components housed in the housing section are discharged from the discharge section towards the support surface of the component support section by being conveyed by the conveyor belt.

Advantageous Effects

With a component supply device of the present disclosure, a conveyor belt is provided between the housing section for housing the components and the discharge section for discharging the components extending diagonally upwards from the housing section to the discharge section, with the housing section and the discharge section being demarcated by the conveyor belt. Components housed in the housing section are discharged from the discharge section by being conveyed by the conveyor belt. Therefore, components are not discharged from the housing section via the discharge section unless the conveyor belt is operated. This prevents components from falling from the discharge section when the component housing apparatus is being mounted to or removed from the mounting section.

DESCRIPTION OF PREFERRED EMBODIMENTS

Figure 1:
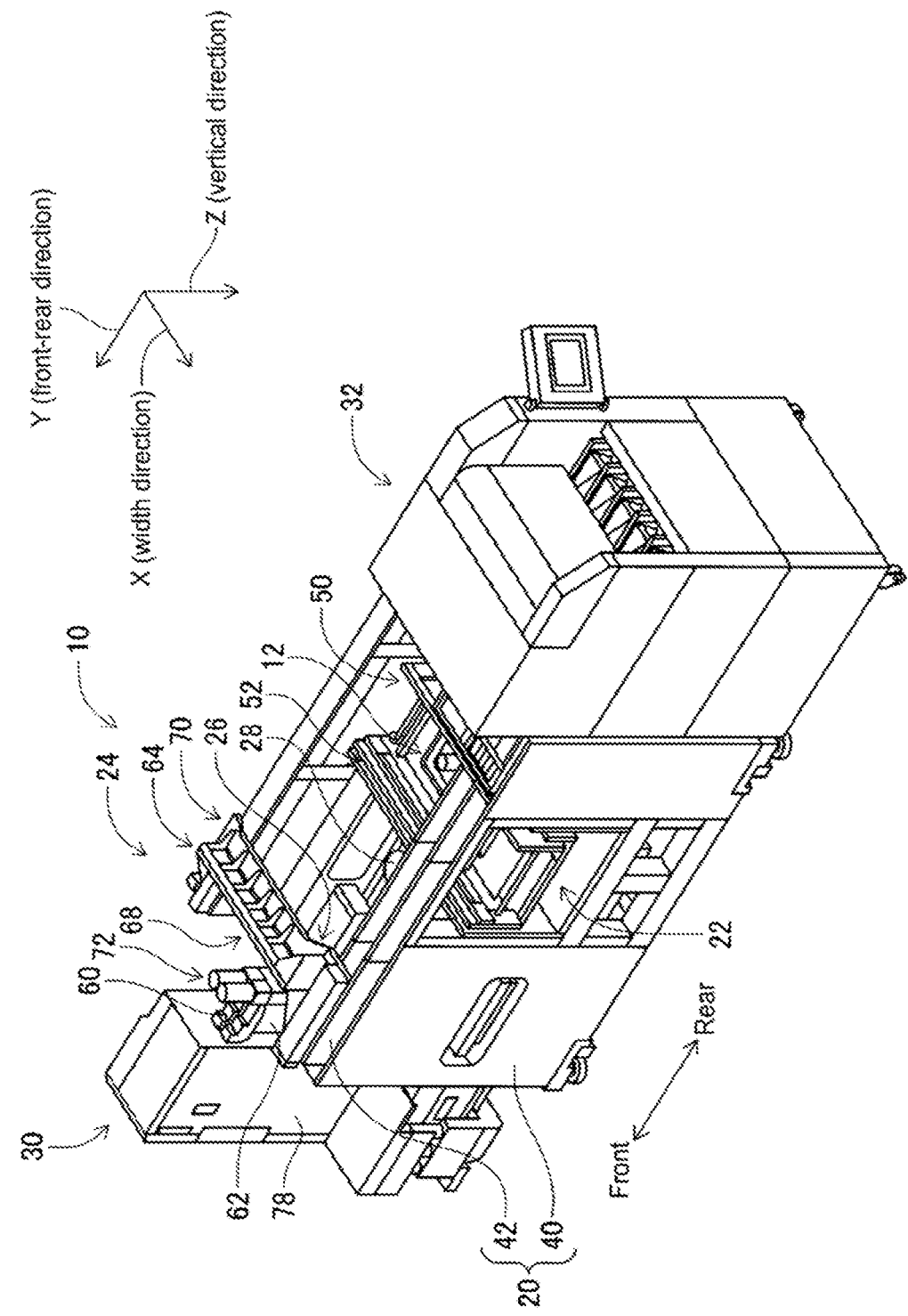
FIG. 1 is a perspective view of a component mounter.

The following describes in detail referring to the figures an example embodiment of the present disclosure.
Configuration of Component Mounter
FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 12). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
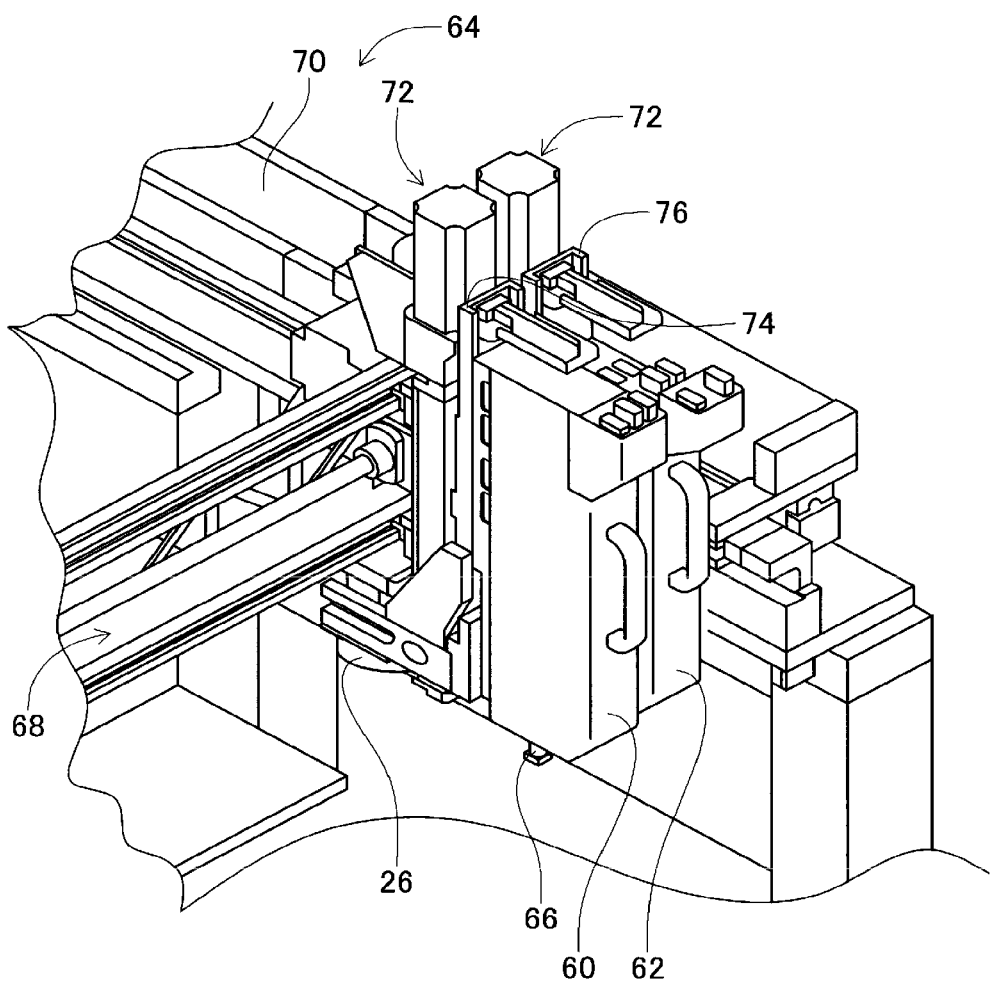
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
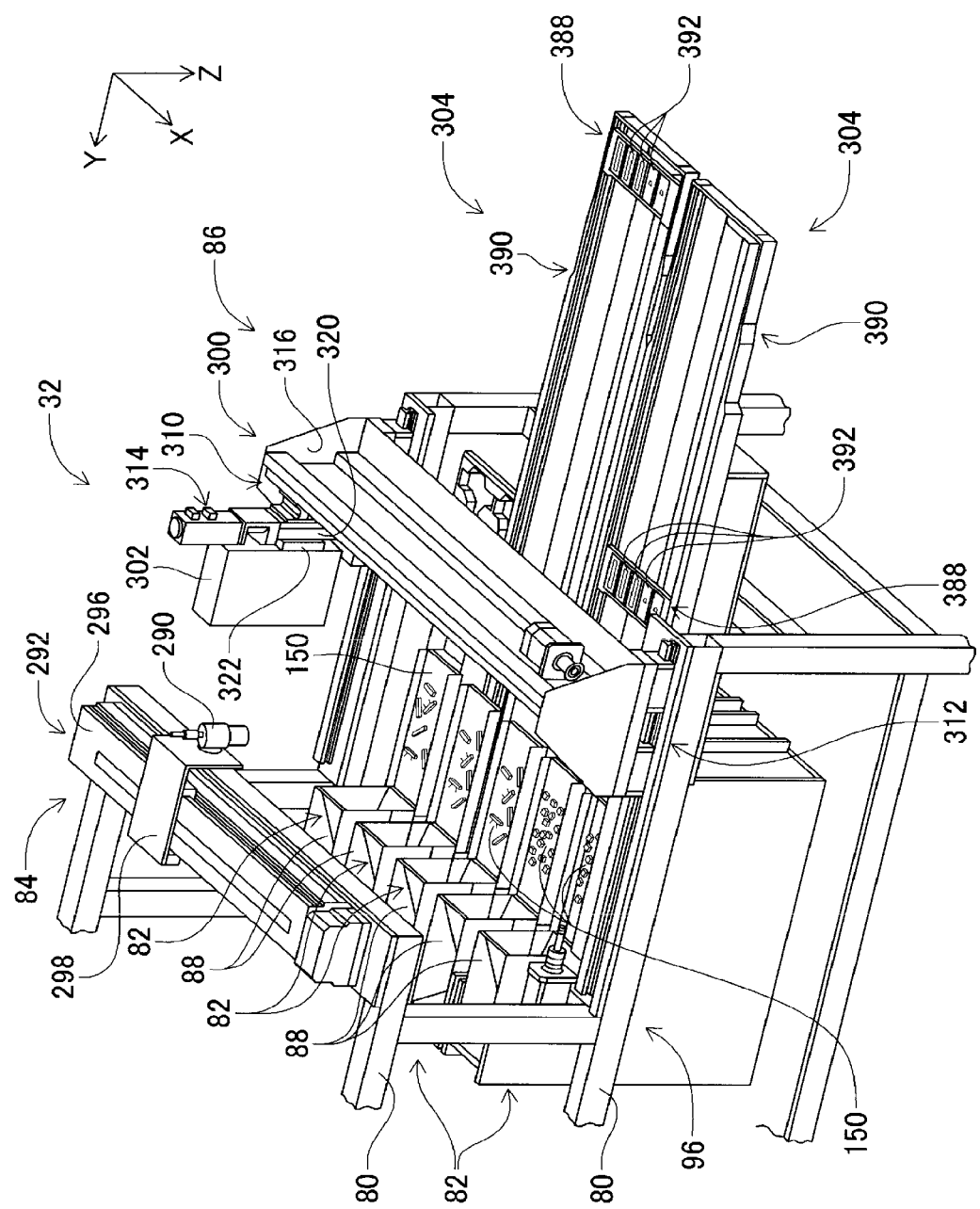
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 5), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

(i) Component Supply Apparatus

Figure 4:
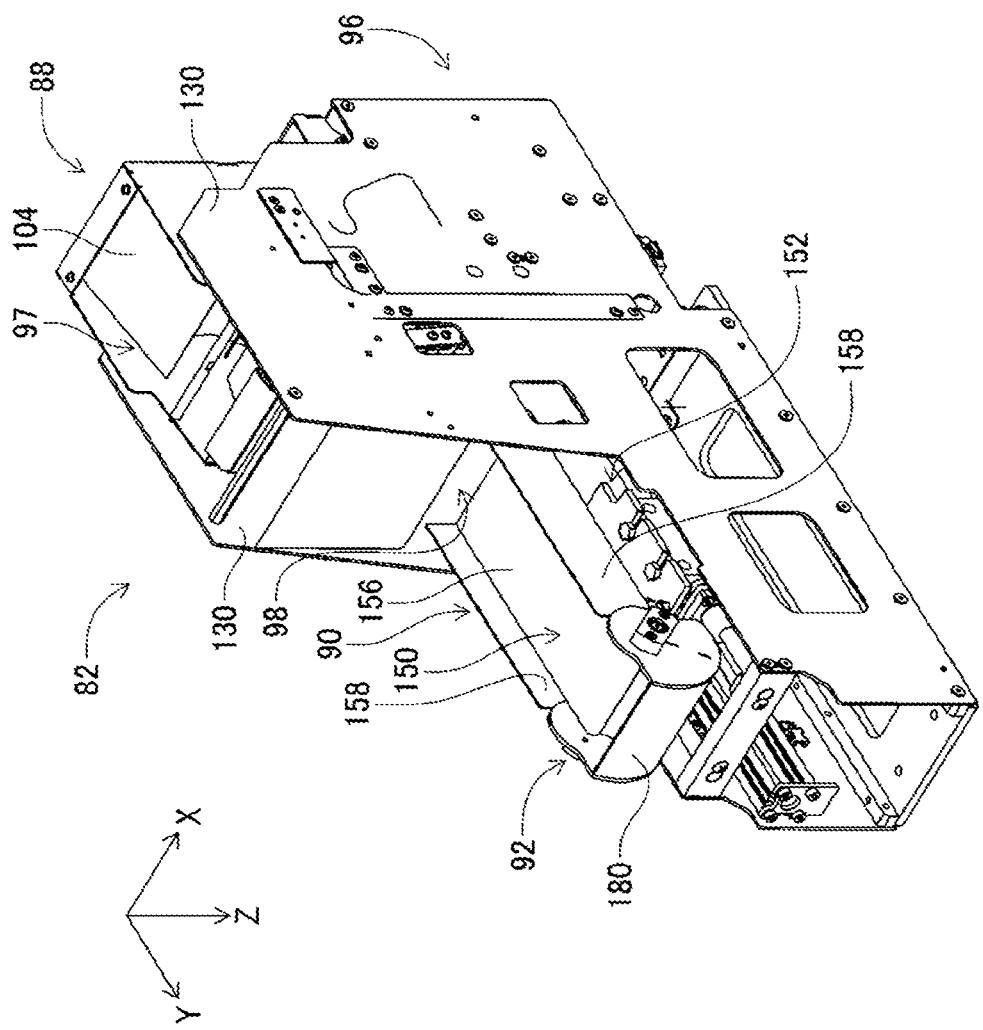
FIG. 4 is a perspective view of a component supply unit.
Figure 5:
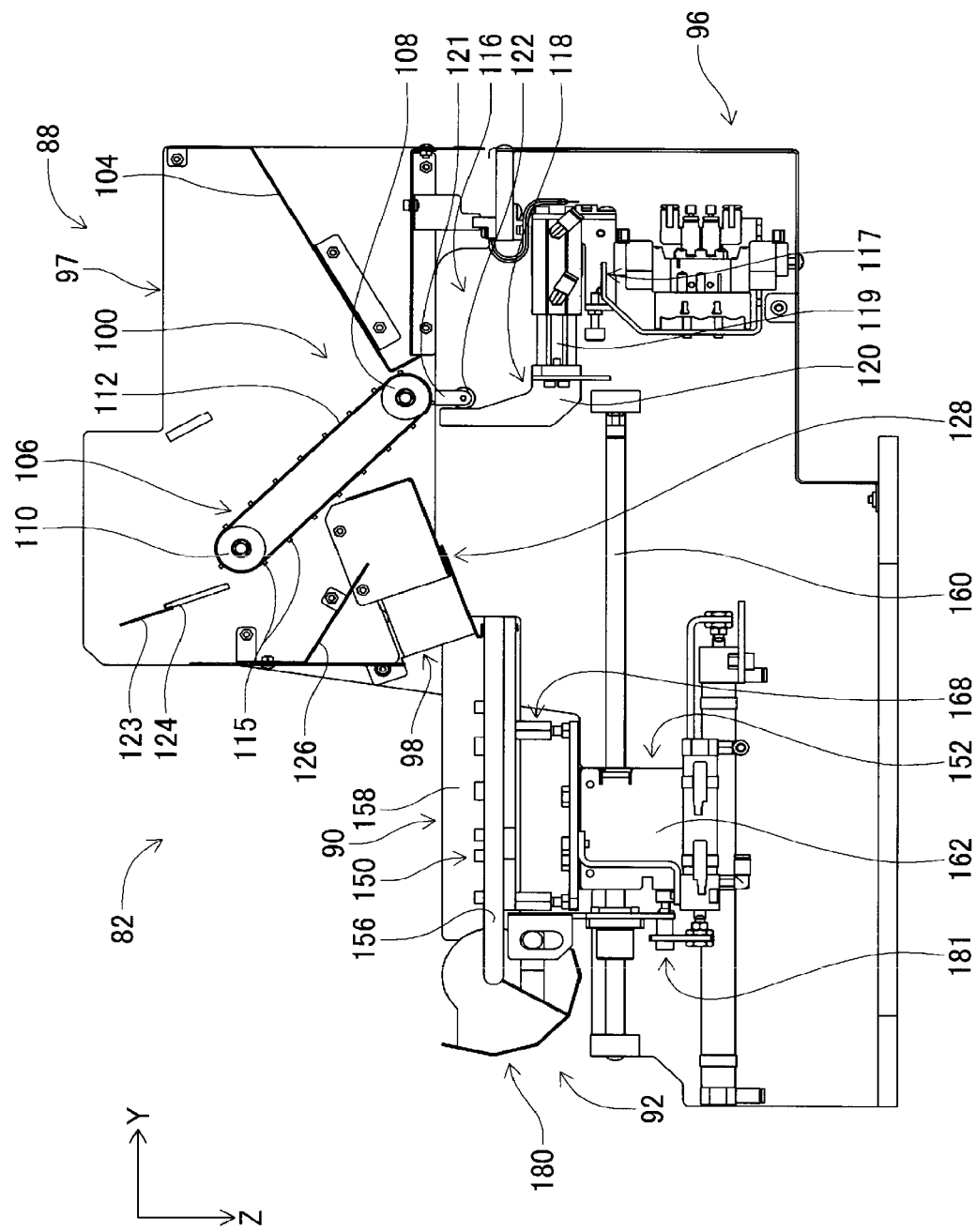
FIG. 5 is a cross section view of the component supply unit.

As shown in FIGS. 4 and 5, component supply apparatus 88 is a substantially cuboid box arranged to extend in the Y direction. The Y direction is the front-rear direction of component supply apparatus 88 with the left side in FIG. 5 sometimes referred to as the front and the right side in FIG. 5 sometimes referred to as the rear. That is, in component supply unit 82, the side toward the end at which component returning device 92 is arranged is sometimes referred to as the front, and the side toward the end at which component supply apparatus 88 is arranged is sometimes referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Further, roller 108 faces the front end of inclined plate 104, that is, the lowest end of inclined plate 104, with a clearance gap between them. Note that, the clearance between the front end of inclined plate 104 and roller 108 is smaller than components that are supplied by component supply apparatus 88. Also, roller 110 is arranged diagonally above and to the front of roller 108. Conveyor belt 112 is stretched over the pair of rollers 108 and 110.

Note that, conveyor belt 112 has a width slightly less than the internal width dimension of component supply apparatus 88. Multiple protrusions 115 are formed in the upper surface, that is, the conveyance surface, of conveyor belt 112 extending across the width of conveyor belt 112. The multiple protrusions 115 are formed at specified intervals in the revolving direction of conveyor belt 112 with the intervals being longer than the length direction of components supplied by component supply apparatus 88.

Also, the pair of rollers 108 and 110 are rotatable around their center axis, with rotation being controlled by operation of rotation device 116. In detail, rotation device 116 includes air cylinder 117 and transmission mechanism 118. Air cylinder 117 is arranged below component supply apparatus 88 and is fixed inside base 96 extending in the Y direction such that the front end of piston rod 119 is facing forward.

Figure 6:
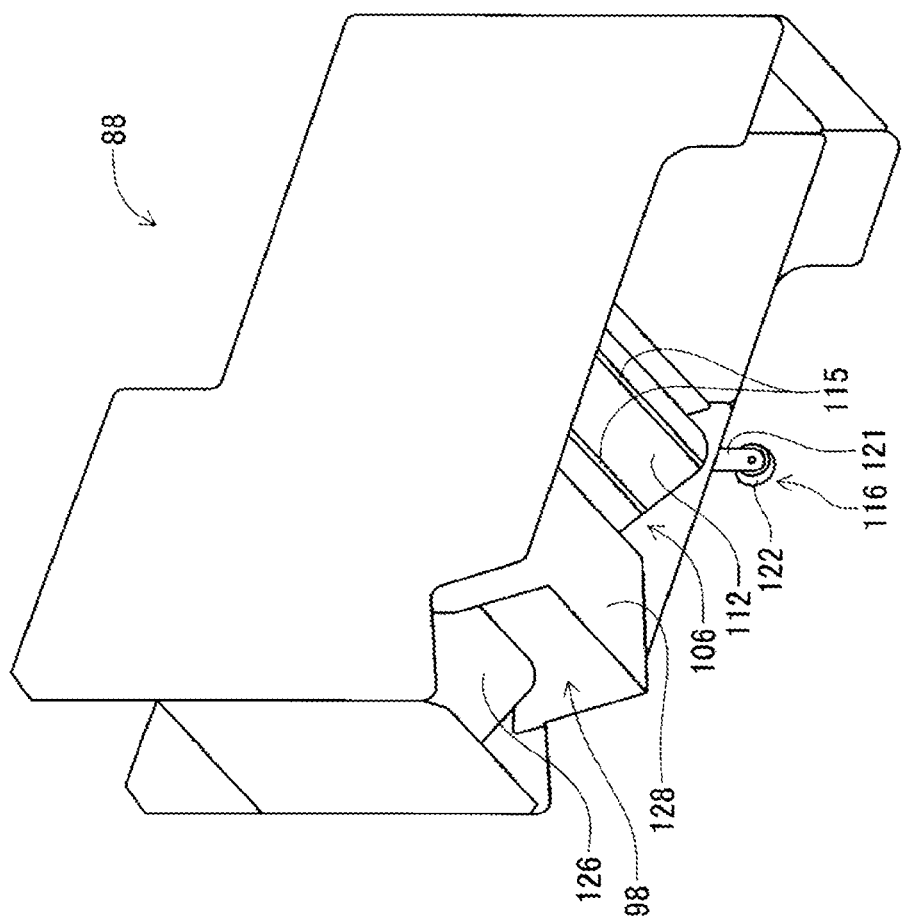
FIG. 6 is a perspective view of a component supply apparatus.

Transmission mechanism 118 includes engaging member 120, arm 121, and roller 122. Engaging member 120 is roughly L-shaped with one end of engaging member 120 being fixed to the front end of piston rod and the other end extending upwards, that is, towards component supply apparatus 88. As shown in FIG. 6, arm 121 is arranged extending down, with an upper end of arm 121 connected to an end of roller 108 of conveyor device 106 via a one-way clutch (not shown). The lower end of arm 121 extends down and, as shown in FIG. 5, faces the rear end of the upper end of engaging member 120. Roller 122 is rotatably provided on the lower end of arm 121 and engages with the rear end of the upper end of engaging member 120. Note that, arm 121 is biased by an elastic member (not shown) in a direction such that the lower end of arm 121 approaches engaging member 120.

According to such a configuration, when air cylinder 117 retracts, engaging member 120 moves towards the rear and the lower end of arm 121 is rotated towards the rear together with roller 122 by being pushed by engaging member 120. On the other hand, when air cylinder 117 extends, engaging member 120 moves towards the front and the lower end of arm 121 is rotated forwards by the elastic force of the elastic member together with roller 122 towards engaging member 120. The one-way clutch is configured to allow roller 108 to rotate when the lower end of arm 121 is rotated towards the rear and to not allow roller 108 to rotate when the lower end of arm 121 is rotated forwards. Therefore, when the lower end of arm 121 is rotated toward the rear in accordance with the retracting of air cylinder 117, roller 108 rotates in the counterclockwise direction of FIG. 5, and when the lower end of arm 121 is rotated towards the front in accordance with the extending of air cylinder 117, roller 108 remains stationary without rotating. By this, conveyor belt 112 revolves around the pair of rollers 108 and 110 in a counterclockwise direction in FIG. 5 in accordance with the extension and retraction of air cylinder 117. In other words, the conveyance direction of conveyor belt 112 is diagonally up from the front end of inclined plate 104.

Also, brush holding section 123 is arranged diagonally above and in front of roller 110 of conveyor device 106. Brush holding section 123 is arranged extending in the width direction of component supply apparatus 88 across the entire width of component supply apparatus 88. Brush 124 is attached to the lower end of brush holding section 123 extending towards roller 110 of conveyor device 106. The width dimension of brush 124 is slightly smaller than the internal width dimension of component supply apparatus 88 and faces conveyor belt 112 wound around roller 110 across the entire width direction of component supply apparatus 88 with a clearance gap between brush 124 and conveyor belt 112. The clearance between the tip of brush 124 and conveyor belt 112 wound around roller 110 is longer than the thickness dimension of components supplied by component supply apparatus 88 and less than two times the thickness dimension of components supplied by component supply apparatus 88.

Also, inclined plate 126 is arranged diagonally below and in front of roller 110 of conveyor device 106. Inclined plate 126 is arranged across the entire width of component supply apparatus 88 and is inclined from the front end surface of component supply apparatus 88 to below roller 110 such that the rear end of inclined plate 126 is positioned lower than the front end. Further, inclined plate 128 is arranged below inclined plate 126. Inclined plate 128 is arranged across the entire width of component supply apparatus 88 and is inclined from below a central portion of conveyor device 106 towards discharge opening 98 of component supply apparatus 88 such that the front end of inclined plate 128 is positioned lower than the rear end. The rear end of inclined plate 128 is positioned further to the rear than the rear end of inclined plate 126, and the rear end of inclined plate 128 is bent upwards at a right angle. The front end inclined plate 128 is bent to the rear to be substantially horizontal.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

(ii) Component Scattering Device

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 so as to be slid to any position by operation of electromagnetic motor 166 (refer to FIG. 12). Stage 156 of component support member 150 is connected to slider 162 via connection mechanism 168. Thus, component support member 150 moves in the Y direction by operation of component support member moving device 152, so as to move to and from a stored state (refer to FIG. 7) stored below component supply apparatus 88 and an exposed state (refer to FIG. 5) drawn out from below component supply apparatus 88.

(iii) Component Returning Device

Figure 8:
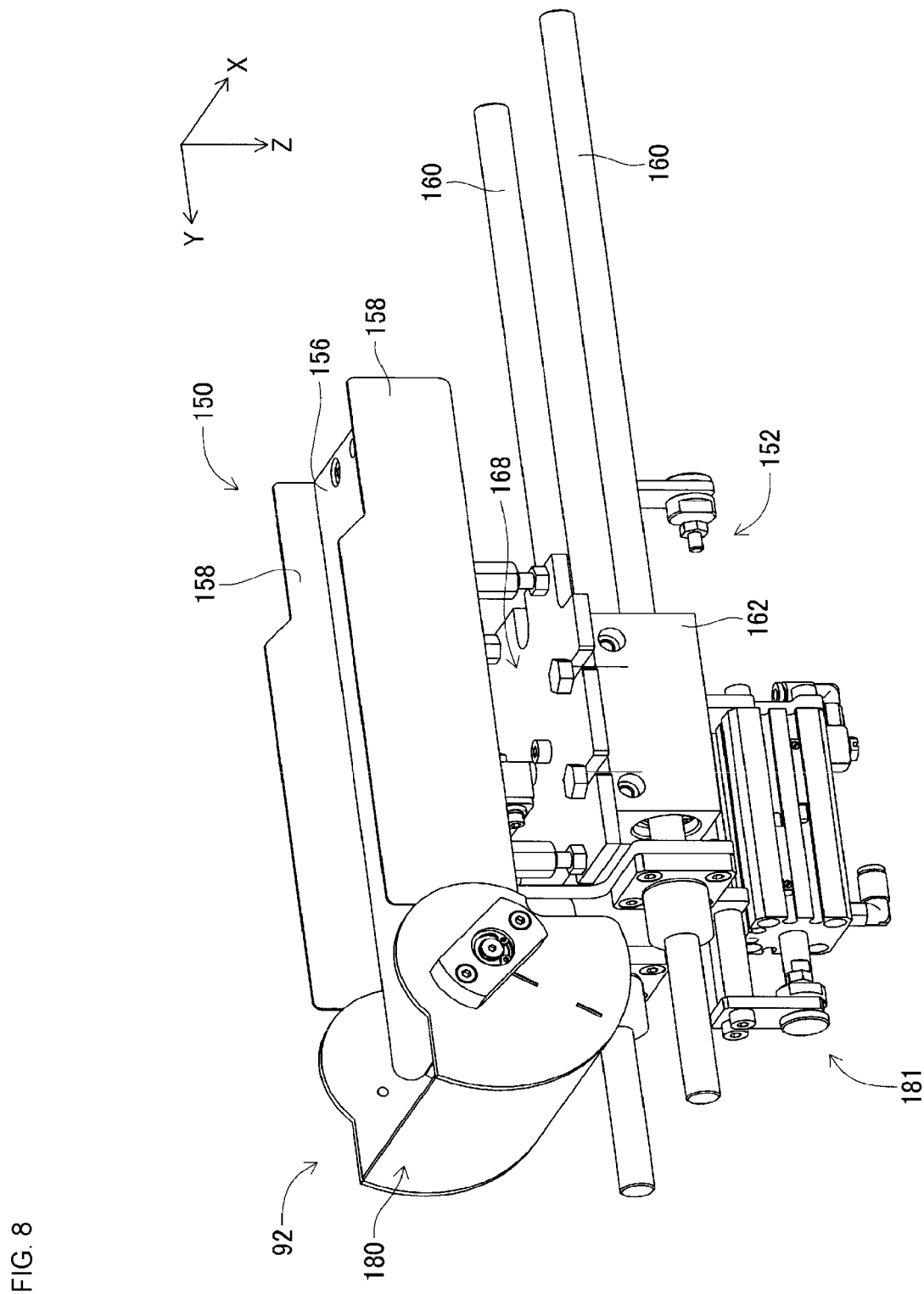
FIG. 8 is a perspective view of a component scattering device.
Figure 9:
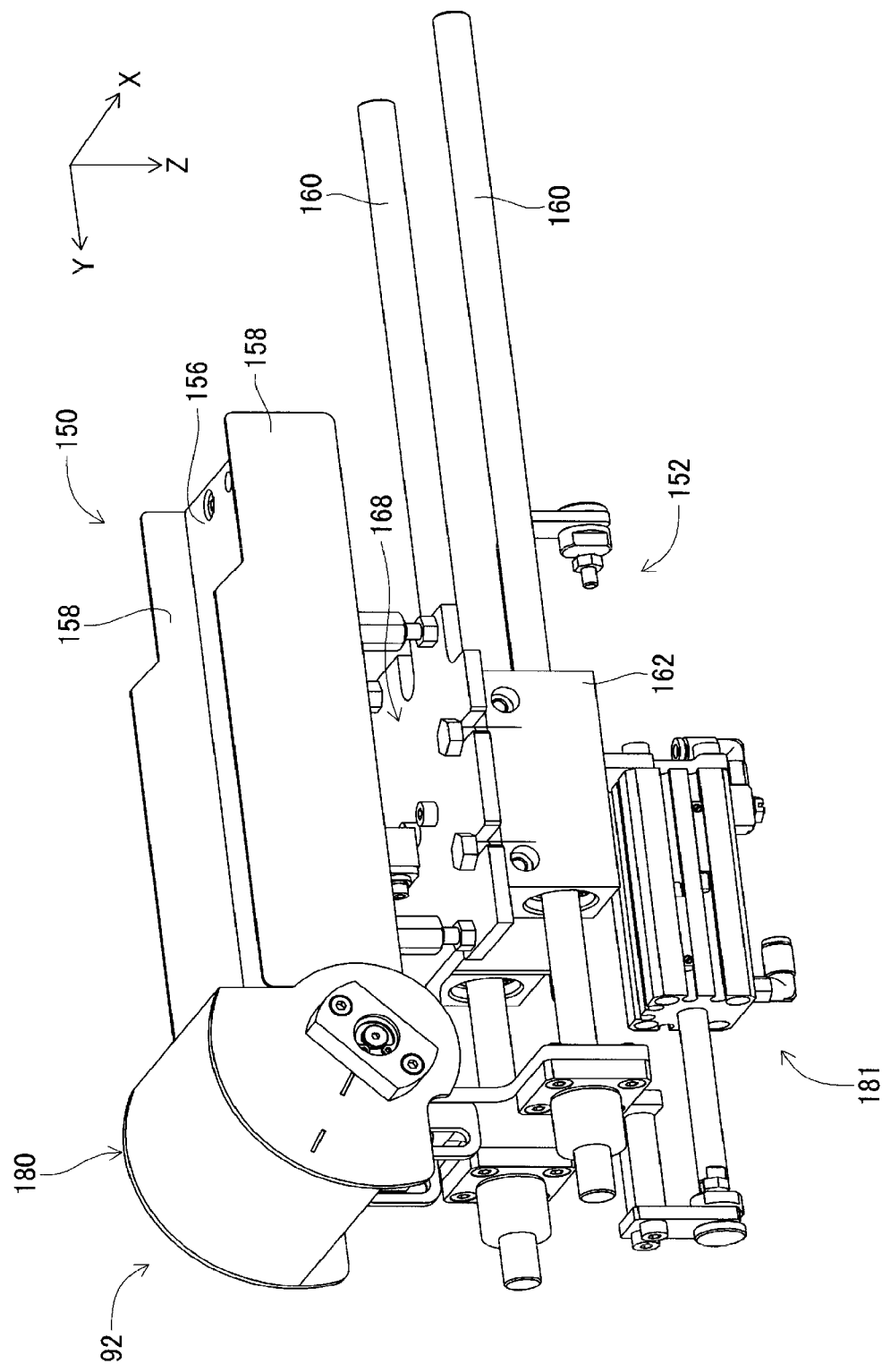
FIG. 9 is a perspective view of a component scattering device.

As shown in FIG. 8, component returning device 92 includes component collection container 180 and container oscillating device 181. Component collection container 180 is a box with an arc-shaped bottom surface. Component collection container 180 is held to be swingable around the front end stage 156 of component holding member 150 and is swung by operation of container oscillating device 181. Here, component collection container 180 is swung between a collection orientation (refer to FIG. 8) with the opening facing up, and a return orientation (refer to FIG. 9) with the opening facing the upper surface of stage 156 of component support member 150.

(b) Imaging Device

As shown in FIG. 3, imaging device 84 includes camera 290 and camera moving device 292. Camera moving 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 12). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 12). X-direction moving device 310 includes X slider 320 provided on a side surface of Y slider 316, and X slider 320 is moved to any position in the X direction by operation of electromagnetic motor 321 (refer to FIG. 12). Z-direction moving device 314 includes Z slider 322 provided on a side surface of X slider 320, and Z slider 322 is moved to any position in the Z direction by operation of electromagnetic motor 323 (refer to FIG. 12).

Figure 10:
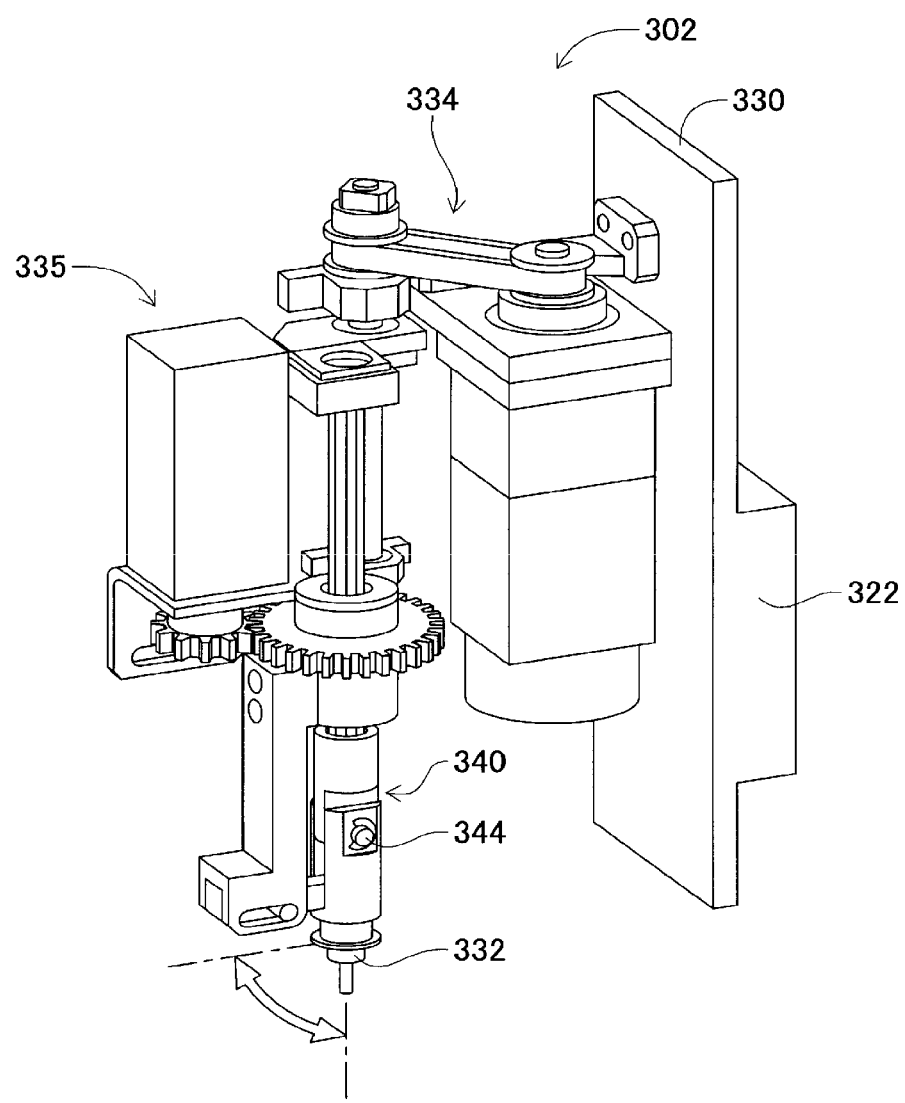
FIG. 10 is a perspective view of a component holding head.

As shown in FIG. 10, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 11:
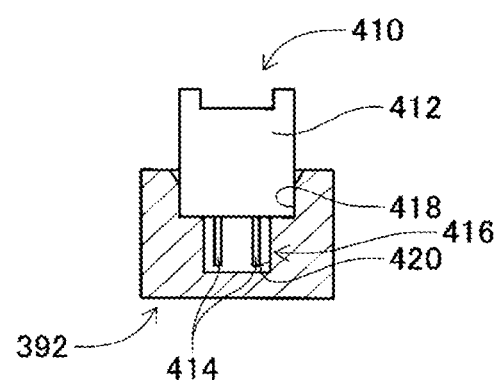
FIG. 11 shows a component receiving member in which is stored a leaded component.

In detail, as shown in FIG. 11, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 12). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 12:
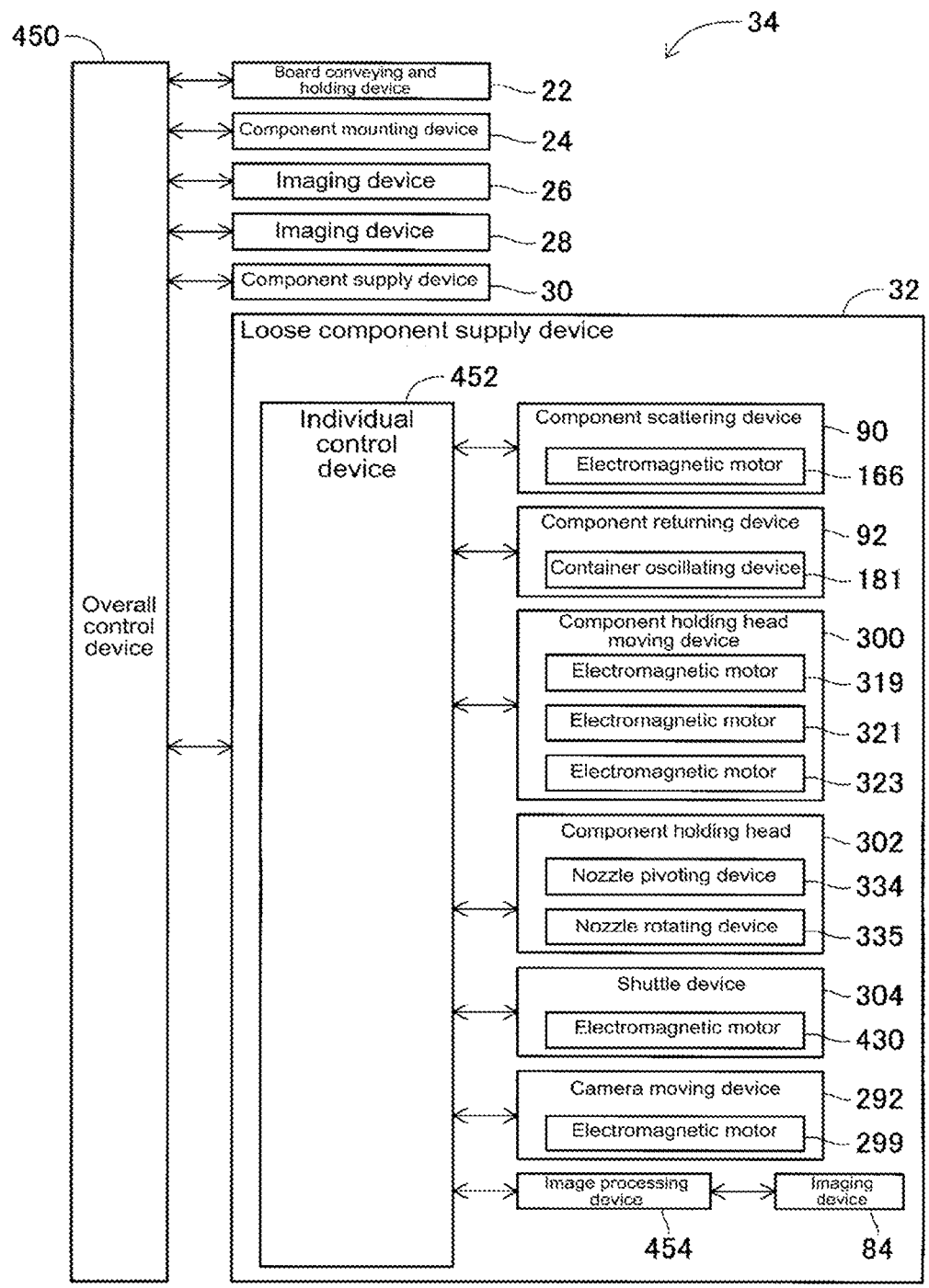
FIG. 12 is a block diagram showing a control device of the component mounter.

Further, as shown in FIG. 12, control device 34 includes overall control device 450, multiple individual control devices (only one is shown in the FIG. 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of Leaded Components Using Loose Component Supply Device With loose component supply device 32, leaded components 410 are inserted by an operator into insertion opening 97 of component supply apparatus 88, then the inserted leaded components 410 are supplied in a state loaded on component receiving member 392 of component carrier 388 by operation of component supply unit 82 and component transfer device 86. In detail, the operator inserts leaded components 410 via insertion opening 97 at the top of component supply apparatus 88. Here, component supporting member 150 is moved below component supply apparatus 88 by operation of component support member moving device 152 to be in a stored state (refer to FIG. 7). With component support member 150 in a stored state, component collection container 180 positioned at the front end of component support member 150 is positioned in front of component supply apparatus 88, and the opening of component collection container 180 is oriented facing up (collection orientation).

Figure 7:
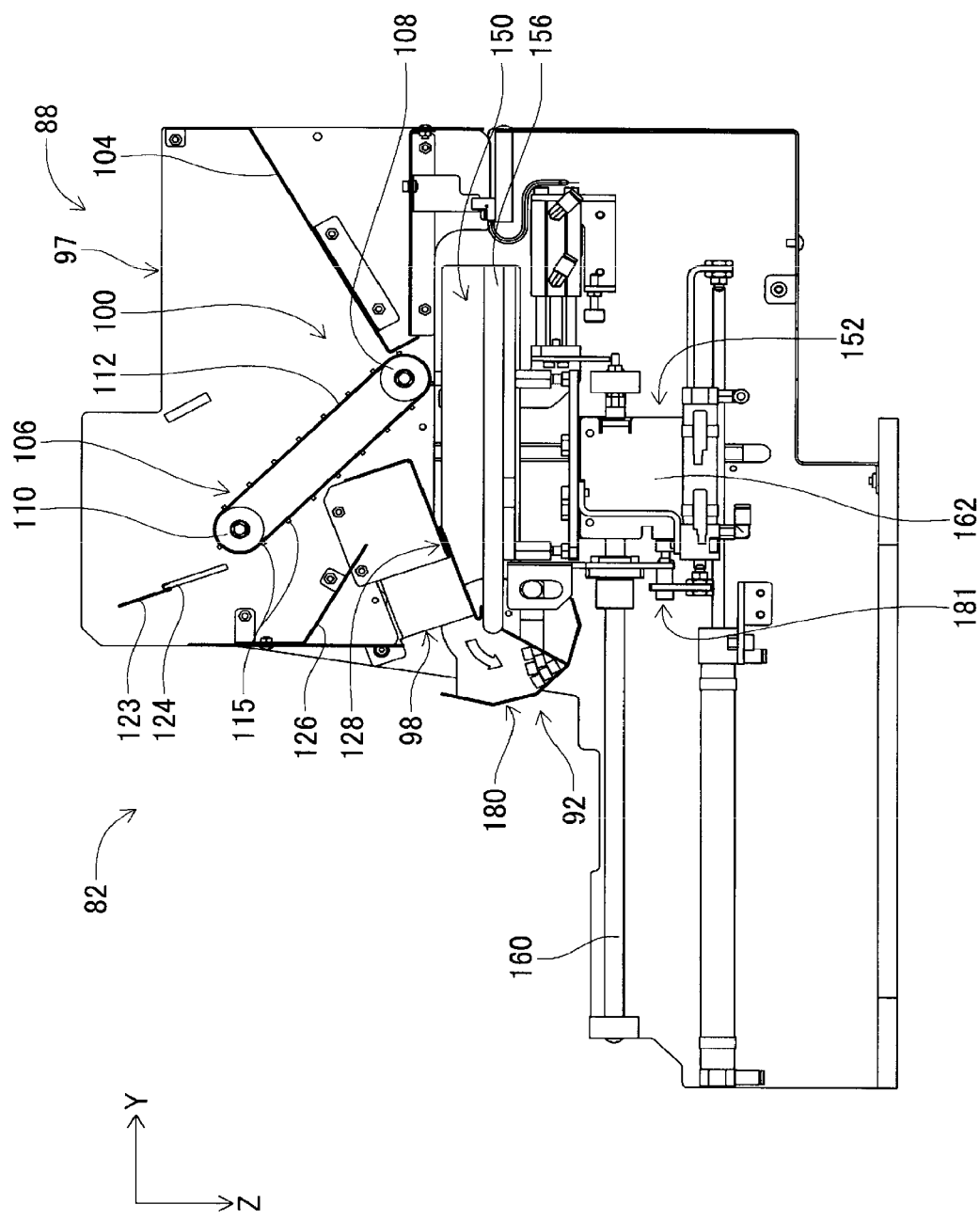
FIG. 7 is a cross section view of the component supply unit.

Leaded components 410 inserted via insertion opening 97 on the top surface of component storage apparatus 88 fall onto inclined plate 104 of component storage apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. In other words, between the lower front end of inclined plate 104 and the lower rear end of conveyor device 106 functions as housing section 100 for housing leaded components 410. Then, when rotation device 116 of conveyor device 106 is operated, conveyor belt 112 of conveyor device 106 is rotated counterclockwise as shown in FIG. 7. By this, leaded components 410 piled up in housing section 100 are conveyed by conveyor belt 112 diagonally up and forward.

Here, because protrusions 115 are formed on the conveyance surface of conveyor belt 112 extending across the width (X direction) of component supply apparatus 88 at a uniform pitch, a specified quantity range of leaded components 410 is conveyed between adjacent protrusions 115. Also, because leaded components 410 are conveyed by conveyor belt 112 that is arranged in an inclined state, leaded components 410 caught by protrusions 115 are conveyed, but leaded components not caught by protrusions 115 such as those piled on top of the upper surface of other leaded components 410 are not conveyed, and instead fall towards housing section 100. Further, leaded components 410 conveyed diagonally upwards by conveyor belt 112 pass between the upper front end of conveyor device 106 and brush 124. The clearance between the upper front of conveyor device 106 and brush 124, as described above, is larger than the thickness dimension of components inserted into component supply apparatus 88 and less than two times the thickness dimension of components inserted into component supply apparatus 88. Therefore, even in a case in which leaded components 410 piled up on other leaded components 410 that are caught by protrusions 115 are conveyed to the upper front end of conveyor device 106, the stacked leaded components 410 contact brush 124 and fall towards housing section 100. By this, with component supply apparatus 88, for example, in a case in which conveyor belt 112 has revolved by a distance equivalent to a pitch at which protrusions 115 are formed, it is possible to convey a specified quantity range of leaded components 410 between adjacent protrusions. In other words, it is possible to convey a roughly fixed quantity of leaded components 410 per unit of time. Also, by controlling the revolving amount of conveyor belt 112, it is possible to control the quantity of leaded components 410 conveyed by conveyor device 106. Note that, because brush 124 that contacts leaded components 410 is formed from a flexible material, damage and so on to leaded components 410 due to contact with brush 124 is effectively prevented. Also, leaded components 410 getting stuck or sandwiched between conveyor 112 and brush 124 is effectively prevented by the bending of brush 124.

Also, leaded components 410 conveyed by conveyor device 106, as described above, pass between the upper front end of conveyor device 106 and brush 124. Then, leaded components 410 fall onto inclined plate 126 arranged between the upper front end of conveyor 106 and brush 124. Leaded components 410 that have fallen onto inclined plate 126 roll towards the rear of inclined plate 126 onto inclined plate 128 provided below inclined plate 126. Then, leaded components 410 that have fallen onto inclined plate 128 roll towards the front and are discharged from discharge opening 98 at the front of component supply apparatus 88. In this manner, leaded components 410 that have fallen from the front end of conveyor device 106 fall onto inclined plate 126 and then onto inclined plate 128. That is, leaded components 410 are discharged from discharge opening 98 of component supply apparatus 88. By this, damage to leaded components 410 due to falling is reduced.

Directly before leaded components 410 are discharged from discharge window 98 of component supply apparatus 88, component support member 150 is moved forwards from below component supply apparatus 88 by operation of component support member moving device 152. In detail, it is possible to estimate the discharge time (estimated discharge time) from the start of conveyance of a leaded component 410 by conveyor device 106, that is, from the start of operation of rotation device 116 of conveyor device 106, to the point when the leaded component 410 is discharged from discharge opening 98 of component supply apparatus 88. Therefore, directly before the estimated discharge time from the start of operation of rotation device 116 of conveyor device 106 elapses, component support member 150 is moved forwards from below component supply apparatus 88 by operation of component support member moving device 152. By this, leaded components 410 discharged from discharge opening 98 of component supply apparatus 88 are discharged onto the upper surface of stage 156 of component support member 150.

Note that, even if a leaded component 410 is discharged faster than the estimated discharge time, when component support member 150 is in the stored state, component collection container is positioned forward of component supply apparatus 88 with the opening facing up (collection position), so the leaded component 410 discharged faster than the estimated discharge time is stored in component collection container 180. Also, leaded components 410 that have been discharged onto stage 156 from component supply apparatus 88 roll forwards, though even if they roll and fall from the front of stage 156 they are stored in component collection container 180. Also, if leaded components 410 that have been discharged onto stage 156 from component supply apparatus 88 roll sideways, they are prevented from falling from stage 156 by side walls 158 of component support member 150.

Then, component support member 150 is moved forwards from the stored state to the exposed state and then movement of component support member 150 is stopped. By this, leaded components 410 are scattered across the entire upper surface of stage 156. However, after component support member 150 has reached the exposed state, if leaded components 410 continue to be discharged from component supply apparatus 88, leaded components 410 tend to pile up on the upper surface of the rear end of stage 156. Therefore, operation of conveyor device 106 is stopped such that the timing of the last leaded component 410 being discharged from component supply apparatus 88 and the timing of component support member 150 moving to the exposed state coincide.

In detail, it is possible to estimate the movement time (estimated movement time) of component support member 150 from the stored state to the exposed state. Therefore, operation of conveyor device 106 is stopped when a period of the estimated movement time minus the estimated discharge time has elapsed from the starting of movement of component support member 150 from the stored state. Thus, it is possible to make the timing of the last leaded component 410 being discharged from component supply apparatus 88 and the timing of component support member 150 moving to the exposed state coincide, and leaded components 410 are therefore scattered evenly on stage 156 without being piled up on the upper surface of the rear end of stage 156. In particular, with component supply apparatus 88, as described above, a roughly fixed quantity of leaded components 410 are conveyed by conveyor belt 112 per unit of time. Therefore, leaded components 410 supplied from component supply apparatus 88 and scattered on stage 156 are scattered across the entire stage 156 in a manner without a large variation in the quantity of leaded components 410 per area unit. In other words, with component supply apparatus 88, it is possible to control the conveyed quantity of leaded components 410 by controlling the revolving amount of conveyor belt 112. Thus, by controlling the revolving amount of conveyor belt 112, it is possible to control the quantity of leaded components 410 scattered per area unit. That is, it is possible to freely adjust the density with which leaded components 410 are scattered across the entire stage 156.

Figure 13:
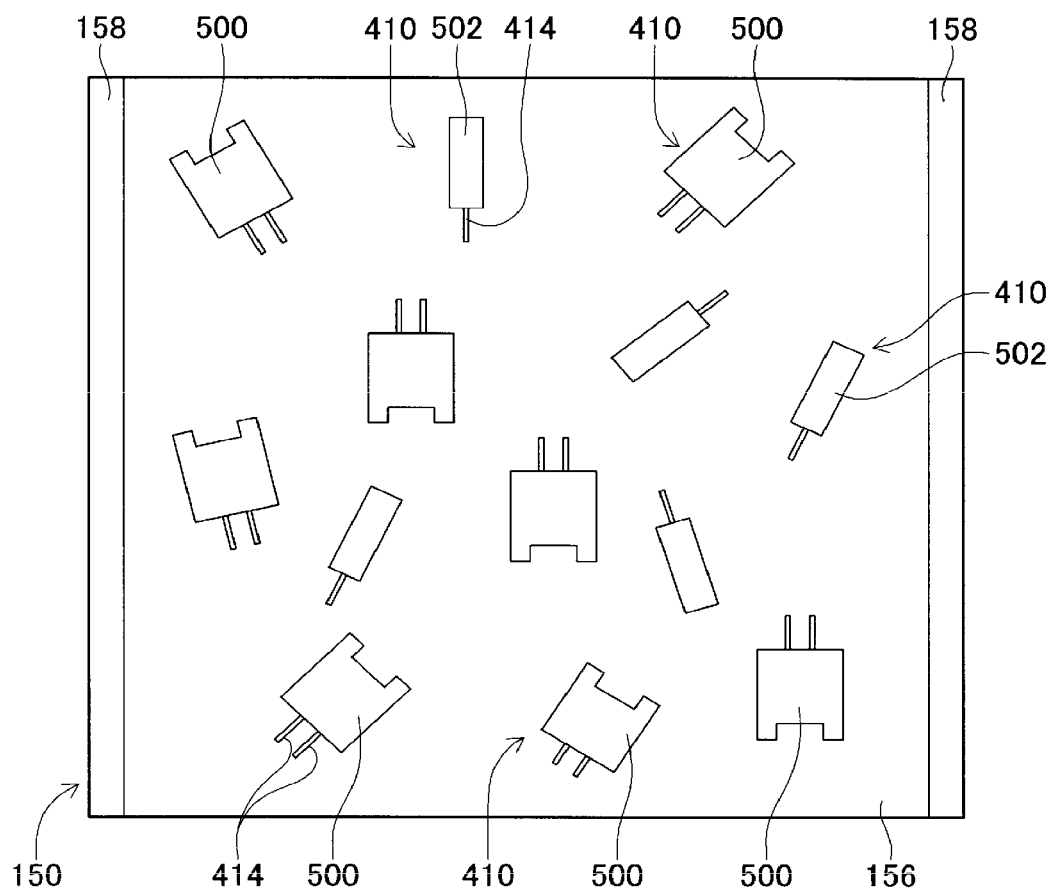
FIG. 13 shows leaded components scattered on a stage.

Note that, when leaded components 410 are scattered on stage 156 of component support member 150 from component storage apparatus 88, as shown in FIG. 13, leaded components 410 are scattered on stage 156 in largely two orientations. Specifically, leaded components 410 are scattered on stage 156 in the following two orientations: an orientation in which the two leads 414 are in a state approximately lined up in a horizontal direction (also referred to as a "first orientation"), and an orientation in which the two leads 414 are in a state approximately lined up in a vertical direction (also referred to as a "second orientation").

When leaded components 410 are scattered on stage 156 as above, camera 290 of imaging device 84, by operation of camera moving device 292, moves above component support member 150 and images leaded components 410. Then, based on the image data imaged by camera 290, a leaded component that is a target for pickup (also referred to as "pickup target component") is identified.

Specifically, based on image data of camera 290, the orientation and position of each of the multiple components scattered on stage 156 is calculated. Then, only leaded components 410 for which the calculated component orientation was the first orientation are identified as pickup target components. This is because, for leaded components 410 in the first orientation, side surface 500 with a large surface area is facing upwards, and it is possible to hold side surface 500 with suction nozzle 332, but for leaded components 410 in the second orientation, side surface 502 with a small surface area is facing upwards, and it is not possible to hold side surface 502 using suction nozzle 332.

Then, when a pickup target component has been identified, that pickup target component is picked up and held by suction nozzle 332. Note that, when the pickup target component is picked up and held by suction nozzle 332, suction nozzle 332 is in the non-pivoted position. Then, after holding leaded component 410 using suction nozzle 332, component holding head 302 is moved above component carrier 388. Then, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 11, leaded component 410 is loaded in component receiving member 392 with leads 414 facing vertically downwards.

Also, when leaded component 410 is loaded on component receiving members 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite to the bottom surface to which leads 414 are connected facing upwards. Therefore, suction nozzle 66 of work head 60 or 62 is able to appropriately hold leaded component 410.

(b) Collection and Replenishment of Leaded Components

With loose component supply device 32, when pickup target components are scattered on stage 156 of component support member 150, pickup of the scattered pickup target components is repeated and the picked up pickup target components are loaded on component receiving member 392. Then, by component carrier 388 mounted on component receiving member 392 being moved to the component supply position, supply of leaded components 410 is performed. However, if there are no pickup target components scattered on stage 156 of component support member 150, that is, all the leaded components 410 in the first orientation that can be picked up have been picked up and only leaded components 410 in the second orientation or the like that cannot be picked up remain on stage 156, it is no longer possible to pick up a leaded component 410 from stage 156.

Thus, with loose component supply device 32, in such a case, leaded components 410 remaining on stage 156 are collected in component collection container 180. Then, leaded components 410 collected into component collection container 18 are scattered again onto stage 156, and by doing so the orientation of the leaded components 410 changes such that pickup of leaded components 410 from stage 156 can be restarted. However, if the quantity of leaded components 410 collected in component collection container 180 is small, it is possible that the quantity of pickup target components on stage 156 will be too small even though leaded components collected in component collection container 180 have been re-scattered onto stage 156. Therefore, in such a case, it is desirable that not only are leaded components 410 collected in component collection container 180 re-scattered, but that leaded components 410 are replenished from component supply apparatus 88. That is, it is desirable that leaded components 410 from both component collection container 180 and component supply apparatus being replenished onto stage 156. Considering this, if the quantity of leaded components remaining on stage 156 is equal to or less than a predetermined set quantity, leaded components 410 are replenished onto stage 156 from both component collection container 180 and component supply apparatus 88, but if the quantity of leaded components remaining on stage 156 is greater than the predetermined set quantity, leaded components 410 are replenished onto stage 156 from only component collection container 180 only.

Detailed descriptions are given below about replenishing leaded components 410 from both component collection container 180 and component supply apparatus onto stage 156. First, component support member 150 is moved below component supply apparatus 88 by operation of component support member moving device 152. That is, component support member 150 is moved from the exposed state (refer to FIG. 5) towards the stored state (refer to FIG. 7). Here, component collection container 180 provided at the front end of component support member 150 is oriented such that the opening is facing up, that is, component support member 150 is in the collection orientation. Then, when component support member 150 is moved from the exposed state towards the stored state, leaded components 410 are discharged onto stage 156 of component support member 150 from component supply apparatus 88. Note that, because the discharge of leaded components 410 from component supply apparatus 88 is performed in the same manner to the procedure described above, descriptions are omitted here.

Figure 14:
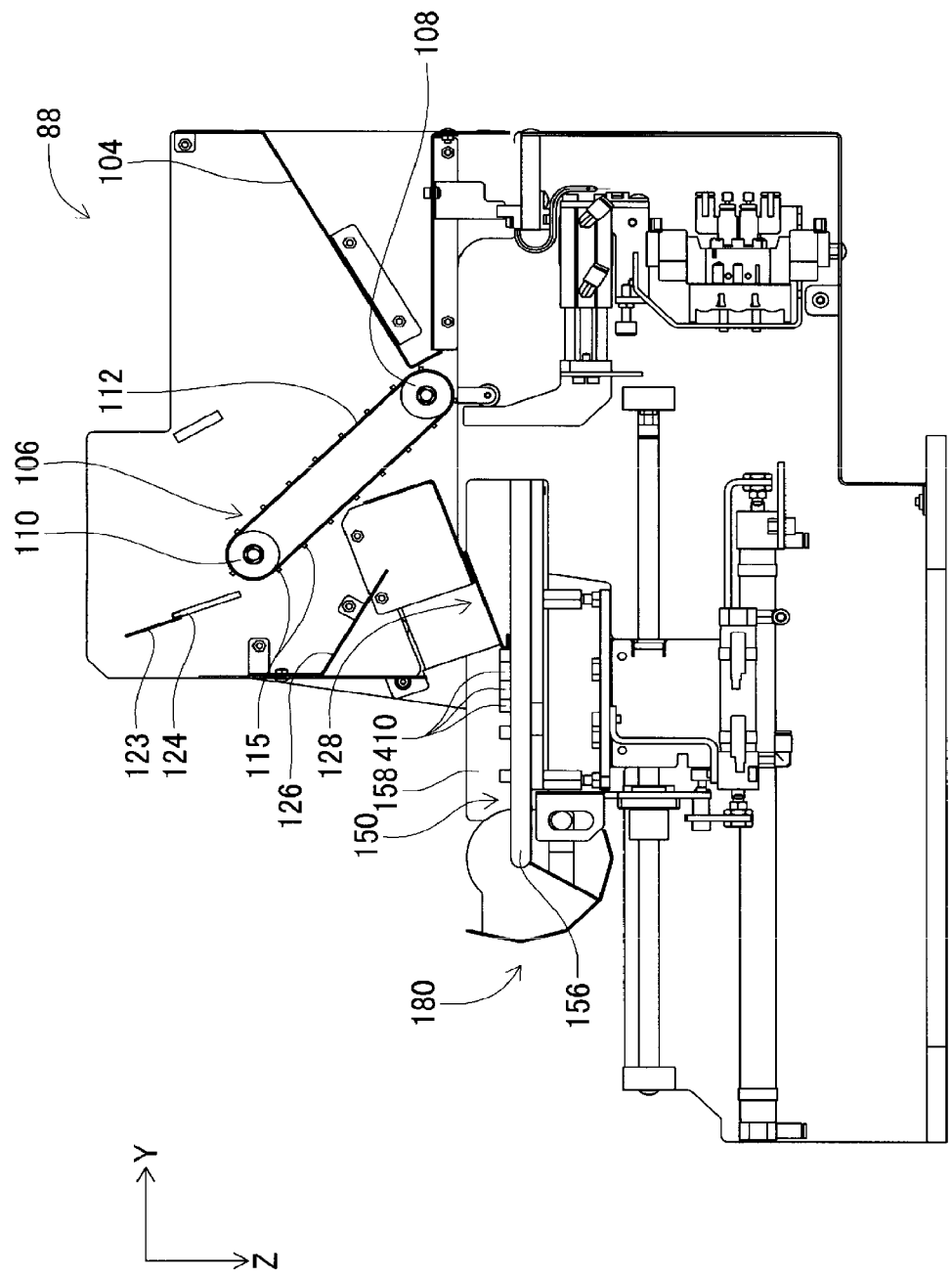
FIG. 14 is a cross section view of the component supply unit.

After the discharging of leaded components 410 from component supply apparatus 88, on stage 156 there are leaded components 410 that remained on stage 156 from before the discharging of leaded components 410 from component supply apparatus 88 and there are leaded components 410 newly discharged from component supply apparatus 88. Note that, also when leaded components 410 are discharged from component supply apparatus 88, component support member 150 moves towards the stored state. Therefore, as shown in FIG. 14, leaded components 410 on stage 156 of component support member 150 are stopped by the front end of inclined plate 128 of component supply apparatus 88 in accordance with the movement of component support member 150. Further, as shown in FIG. 7, when component support member 150 reaches the stored state, leaded components 410 on stage 156 fall inside component collection container 180. By this, leaded components 410 remaining on stage 156 are collected in component collection container 180. In other words, leaded components 410 discharged from component supply apparatus 88 when component support member 150 was moving towards the stored state and leaded components 410 remaining on stage 156 from before the leaded components 410 were discharged from component supply apparatus 88 are collected in component collection container 180.

According to the above procedure, when leaded components 410 are collected in component collection container 180, those leaded components 410 are replenished onto stage 156. In detail, when collection of leaded components 410 into component collection container 180 is complete, as shown in FIG. 7, component support member 150 is in the stored state. Therefore, component support member 150 is moved from the stored state towards the front by the operation of component support member moving device 152. Note that, when component support member 150 is moved forwards from the stored state, conveyor device 106 of component supply apparatus is not operated. That is, leaded components 410 are not discharged onto stage 156 from component supply apparatus 88.

Also, when component support member 150 has been moved forward from the stored state by a specified amount, container swinging device 181 of component returning device 92 is operated and component collection container 180 is swung. Note that, when component collection container 180 is swung, the specified amount that component support member 150 is moved forward from the stored state is set in advance, with a specified area of stage 156 to which replenishment of leaded components 410 from component collection container 180 is to occur set as the movement quantity of component support member 150 when being exposed from below component supply apparatus 88. Also, movement of component support member 150 does not stop even when component collection container 180 swings. That is, component collection apparatus 180 swings while component support member 150 is moving.

Here, the orientation of component collection container 180 changes from an orientation with the opening facing up (collection orientation) to an orientation with the opening facing stage 156 (returning orientation) by the swinging of component collection container 180. By this, leaded components 410 collected in component collection container 180 are replenished onto stage 156 in a scattered state. Note that, as described above, when component collection container 180 is swung, component support member 150 also moves, and when reaching the exposed state, movement of component support member 150 is stopped. Also, after leaded components 410 have been scattered on stage 156 from component collection container 180, the orientation of component collection container 180 returns from the orientation with the opening facing stage 156 (returning orientation) to the orientation with the opening facing up (collection orientation).

Further, when leaded components 410 are replenished onto stage 156 from only component collection container 180, in the same manner as when leaded components are replenished from both component collection container 180 and component supply apparatus 88, first, component support member 150 is moved from the exposed state towards the stored state. However, leaded components 410 are not replenished from component supply apparatus 88. Leaded components 410 on stage 156 are stopped by the front end of inclined plate 122 of component supply apparatus 88 in accordance with the movement of component support member 150. Further, by moving component support member 150 to the stored state, leaded components 410 on stage 156 fall inside component collection container 180. By this, leaded components 410 remaining on stage 156 are collected in component collection container 180. Here, for component collection container 180, only leaded components 410 remaining on stage 156 after pick up from stage 156 are collected in component collection container 180. When component support member 150 reaches the stored state, component support member 15 is moved again towards the exposed state. In this case, component collection container 180 is swung based on the following procedure. By this, leaded components 410 collected in component collection container 180 are replenished onto stage 156.

In this manner, with loose component supply device 32, leaded components 410 are replenished onto stage 156 from both component collection container 180 and component supply apparatus 88 or from only component collection container 180, in accordance with the quantity of leaded components 410 remaining on stage 156. When leaded components 410 are replenished onto stage 156 from both component collection container 180 and component supply apparatus 88 or from only component collection container 180, the leaded components 410 replenished onto stage 156 are imaged by camera 290 of imaging device 84, and based on the image data captured by camera 290, pickup target component are identified again. Then, the identified pickup target components are picked up and held by suction nozzle 332 and, according to a procedure described above, supply of the leaded components 410 is performed by loose component supply device 32.

That is, with loose component supply device 32, when there are no more leaded components 410 orientated on stage 156 such that pickup is possible and only leaded components 410 for which pickup is not possible remain, the leaded components 410 for which pickup is not possible are collected into component collection container 180. Alternatively, the leaded components 410 for which pickup is not possible and leaded components 410 discharged onto stage 156 from component supply apparatus 88 are collected in component collection container 180. Then, the leaded components 410 collected in component collection container 180 are re-scattered on stage 156, such that the orientation of the leaded components 410 on stage 156 is changed. By this it is possible to supply leaded components 410 onto stage 156 in an orientation for which pickup is possible in a relatively short time.

With loose component supply device 32, as described above, component supply apparatus 88 is removably attached between the pair of side frame sections 130. Therefore, by removing component supply apparatus 88 from between the pair of side frame sections 130 it is possible to perform actions such as maintenance of component supply apparatus 88 and collection of leaded components 410 from component supply apparatus 88 externally from loose component supply device 32. As shown in FIG. 5, with component supply apparatus 88, conveyor device 106 is arranged in an inclined state between housing section 100 in which leaded components 410 are stored and discharge opening 98 through which leaded components are discharged. That is, housing section 100 and discharge opening 98 are demarcated by conveyor device 106. Therefore, leaded components 410 are not discharged from component supply apparatus 88 without conveyor device 106 being operated. Accordingly, when component supply apparatus 88 is removed from between the pair of side frame sections 130, leaded components 410 are effectively prevented from falling from component supply apparatus 88.

Also, the drive source for revolving conveyor belt 112, that is, air cylinder 117 of rotating device 116, may be provided on base 96 on which component supply apparatus 88 is provided without being provided directly on component supply apparatus 88. Further, engaging member 120 of transmission mechanism 118 that transmits driving power of air cylinder 117 to conveyor belt 112 is provided on base 96 and arm 121 and roller 122 of transmission mechanism 118 are provided on component supply apparatus 88. Thus, by mounting component supply apparatus on base 96, engaging member 120 and roller 120 engage with each other and the driving power of air cylinder 117 is transmitted to conveyor belt 112. In other words, air cylinder 117 and a portion of transmission mechanism 118 (engaging member 120) that have a relatively complex construction, are heavy, and require a large space are provided on base 96 while a portion of transmission mechanisms 188 that have a relatively simple construction, are light, and require a small space (arm 121 and roller 122) are provided on component supply apparatus 88. Thus, the configuration of component supply apparatus 88 is simpler, lighter, and more compact.

Note that, loose component supply device 32 is an example of a component supply device. Component supply apparatus 88 is an example of a component housing apparatus. Base 96 is an example of a mounting section. Discharge opening 98 is an example of a discharge opening. Housing section 100 is an example of a housing section. Conveyor belt 112 is an example of a conveyor belt. Protrusion 115 is an example of a protrusion. Rotating device 116 is an example of a revolving device. Air cylinder 117 is an example of a drive source. Transmission mechanism 118 is an example of a transmission mechanism. Engaging member 120 is an example of a mounting section transmission mechanism. Arm 121 and roller 122 are examples of a storage container transmission mechanism. Brush 124 is an example of a flexible member. Component support member 150 is an example of a component support member. An upper surface of stage 156 is an example of a support surface.

Further, the present disclosure is not limited to the above example embodiments, and various changed or improved methods of embodiment are possible based on the knowledge of someone skilled in the art. Specifically, for example, in an embodiment above, a portion of transmission mechanism 118 for transmitting driving power of air cylinder 117 to conveyor belt 112 is provided on component supply apparatus 88, and the remaining portion of transmission mechanism 118 is provided on base 96, but all of transmission mechanism 188 may be provided on either of component supply apparatus 88 or base 96.

Also, in an embodiment above, when component supply apparatus is mounted on base 96, a portion of transmission mechanism 118 provided on component supply apparatus 88, that is, roller 122 and a portion of transmission mechanism 118 provided on base 96, that is, engaging member 120, engage with each other, but it is not necessary for a portion of transmission mechanism 118 provided on component supply apparatus 88 and a portion of transmission mechanism 118 provided on base 96 to engage with each other. In this case, for example, driving power of air cylinder 117 may be transmitted from portion of transmission mechanism 118 provided on base 96 to a portion of transmission mechanism 118 provided on component supply apparatus 88 via magnetism.

Further, in an embodiment above, when an operator inserts leaded components 410 into component supply apparatus 88, component support member 150 is moved to the stored state, but the configuration may be such that an operator can insert leaded components 410 into component supply apparatus 88 whatever position component support member 150 is moved to.

Also, in an embodiment above, when component support member 150 is moved from the exposed state to the stored state when leaded components 410 are replenished onto stage 156 from both component collection container 180 and component supply apparatus 88, leaded components 410 are discharged from component support member 150, but leaded components 410 may be discharged from component supply apparatus 88 when component support member 150 is moved from the stored state to the exposed state. In other words, in an embodiment above, leaded components 410 discharged from component supply apparatus onto stage 156 may be temporarily collected in component collection container 180 and then replenished onto stage 156 from component collection container 180. However, by discharging leaded components 410 from component supply apparatus 88 when component support member 150 is moved from the stored state to the exposed state, leaded components 410 discharged from component supply apparatus 88 remain scattered on stage 156 without being collected in component collection container 180. That is, when component support member 150 is moved from the stored state to the exposed state, leaded components 410 are replenished onto stage 156 from component supply apparatus 88, and by the swinging of component collection container 180 leaded components 410 are replenished onto stage 156 from component collection container 180.

Also, in embodiments above, the present disclosure is applied to leaded components, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device);
88: component supply apparatus (component housing apparatus);
96: base (mounting section);
98: discharge opening (discharge section);
100: housing section;
112: conveyor belt;
115: protrusion;
116: rotating device (revolving device);
117: air cylinder (drive source);
118: transmission mechanism;
120: engaging member (mounting section transmission mechanism;
121: arm (storage container transmission mechanism);
122: roller (storage container transmission mechanism);
124: brush (flexible member);
150: component support member (component support section);
156: stage (support surface)

The invention claimed is:

1. A component supply device comprising:
a component support section configured to support multiple components in a scattered state on a support surface of the component support section;
a component housing apparatus configured to house the components and to discharge the components from a discharge section towards the support surface of the component support section; and
a mounting section on which the component housing apparatus is removably mounted, wherein
the component housing apparatus includes a housing section configured to house the components, the housing section arranged between a conveyor belt extending diagonally upwards towards the discharge section and a first inclined plate extending diagonally upwards and away from the conveyor belt, and
the components housed in the housing section are conveyed from the housing section to the discharge section by the conveyor belt and discharged from the discharge section towards the support surface of the component support section.

2. The component supply device according to claim 1, wherein
the component housing apparatus includes a flexible member arranged above the conveyor belt with a clearance gap between the flexible member and the conveyor belt in accordance with a dimension of the component housed in the housing section.

3. The component supply device according to claim 1, wherein
a protrusion is formed on a conveyance surface of the conveyor belt, the protrusion extending across the conveyance surface of the conveyor belt in a direction at an angle to a conveyance direction of the component as conveyed by the conveyor belt.

4. The component supply device according to claim 1, further comprising:
a revolving device configured to revolve the conveyor belt, the revolving device including
a drive source arranged on the mounting section, and
a transmission mechanism arranged on at least one of the mounting section and the component housing apparatus, the transmission mechanism being configured to transmit drive power of the drive source to the conveyor belt of the component housing apparatus mounted on the mounting section.

5. The component supply device according to claim 4, wherein
the transmission mechanism includes
a mounting-section-side transmission mechanism arranged on the mounting section and
a housing-container-side transmission mechanism arranged on the component housing apparatus, and
the transmission mechanism transmits drive power of the drive source from the mounting-section-side transmission mechanism to the housing-container-side transmission mechanism when the component housing apparatus is mounted on the mounting section.

6. The component supply device according to claim 2, wherein the component housing apparatus includes a second inclined plate below the flexible member and above the discharge section, the second inclined plate configured to receive the components from the conveyor belt that pass by the flexible.

7. A component supply device comprising:
a component support section configured to support multiple components in a scattered state on a support surface of the component support section;
a component housing apparatus configured to house the components and to discharge the components from a discharge section towards the support surface of the component support section, the component housing apparatus including
a housing section configured to house the components, and
a conveyor belt configured to demarcate the housing section and the discharge section and arranged extending from the housing section diagonally upwards to a side on which the discharge section is provided;
a mounting section on which the component housing apparatus is removably mounted;
a revolving device configured to revolve the conveyor belt, the revolving device including
a drive source arranged on the mounting section, and
a transmission mechanism arranged on at least one of the mounting section and the component housing apparatus, the transmission mechanism being configured to transmit drive power of the drive source to the conveyor belt of the component housing apparatus mounted on the mounting section, the transmission mechanism including a mounting-section-side transmission mechanism arranged on the mounting section, and a housing-container-side transmission mechanism arranged on the component housing apparatus, wherein the components housed in the housing section are discharged from the discharge section towards the support surface of the component support section by being conveyed by the conveyor belt, and the transmission mechanism transmits drive power of the drive source from the mounting-section-side transmission mechanism to the housing-container-side transmission mechanism when the component housing apparatus is mounted on the mounting section.

\* \* \* \* \*